US006600187B2

(12) United States Patent
Kim

(10) Patent No.: US 6,600,187 B2
(45) Date of Patent: Jul. 29, 2003

(54) SEMICONDUCTOR MEMORY DEVICE AND METHOD FOR MANUFACTURING THE SAME

(75) Inventor: Jeong-Seok Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/916,736

(22) Filed: Jul. 26, 2001

(65) Prior Publication Data

US 2002/0033495 A1 Mar. 21, 2002

(30) Foreign Application Priority Data

Sep. 18, 2000 (KR) ........................... 2000-54625

(51) Int. Cl.[7] ................ H01L 27/108; H01L 29/76; H01L 31/119
(52) U.S. Cl. ................ 257/296; 257/304; 257/305
(58) Field of Search ............... 257/296–311, 324, 257/326, 295; 438/238, 239, 243, 253–256, 396–399, 301–306; 365/182–184, 186, 187

(56) References Cited

U.S. PATENT DOCUMENTS

| 5,434,093 A | * | 7/1995 | Chau et al. ............... 438/300 |
| 5,541,427 A | * | 7/1996 | Chappell et al. ............ 257/306 |
| 5,858,831 A | * | 1/1999 | Sung ..................... 438/241 |
| 5,904,530 A | | 5/1999 | Shin ..................... 438/291 |
| 6,200,850 B1 | * | 3/2001 | Wu ...................... 438/241 |

OTHER PUBLICATIONS

D.W. Ha, Self Aligned Local Implantation Using Reverse Gate Pattern for Deep Submicron DRAM Cell Tansistors Jpn. J. Appl. Phys. vol. 37(1998) pp. 1059.

* cited by examiner

*Primary Examiner*—Shouxiang Hu
(74) *Attorney, Agent, or Firm*—Marger Johnson & McCollom, P.C.

(57) ABSTRACT

A technology of preventing the threshold voltage of the transistor of a cell region from increasing and the refresh characteristic of the transistor of the cell region from deteriorating, while maintaining the characteristic of the transistor of core circuit/peripheral circuit regions of a semiconductor memory device, is provided. A semiconductor memory device comprises a first transistor comprised of a first gate, a first gate insulating film, a first source region, and a first drain region formed in core circuit/peripheral circuit regions of a semiconductor memory device having a cell region and core circuit/peripheral circuit regions, a planarized interlayer dielectric film which covers the first transistor, and a second transistor formed in the cell region, including a second source region, a second drain region, a second gate having a height corresponding to the height of the interlayer dielectric film, and a second gate insulating film. The first transistor is formed using conventional manufacturing processes, the second transistor is formed by a damascene method, using the interlayer dielectric film as the basis of a reverse gate pattern.

20 Claims, 10 Drawing Sheets

SEMICONDUCTOR MEMORY DEVICE AND METHOD FOR MANUFACTURING THE SAME

BACKGROUND OF THE INVENTION

1. Field of the Invention

Figure 1:
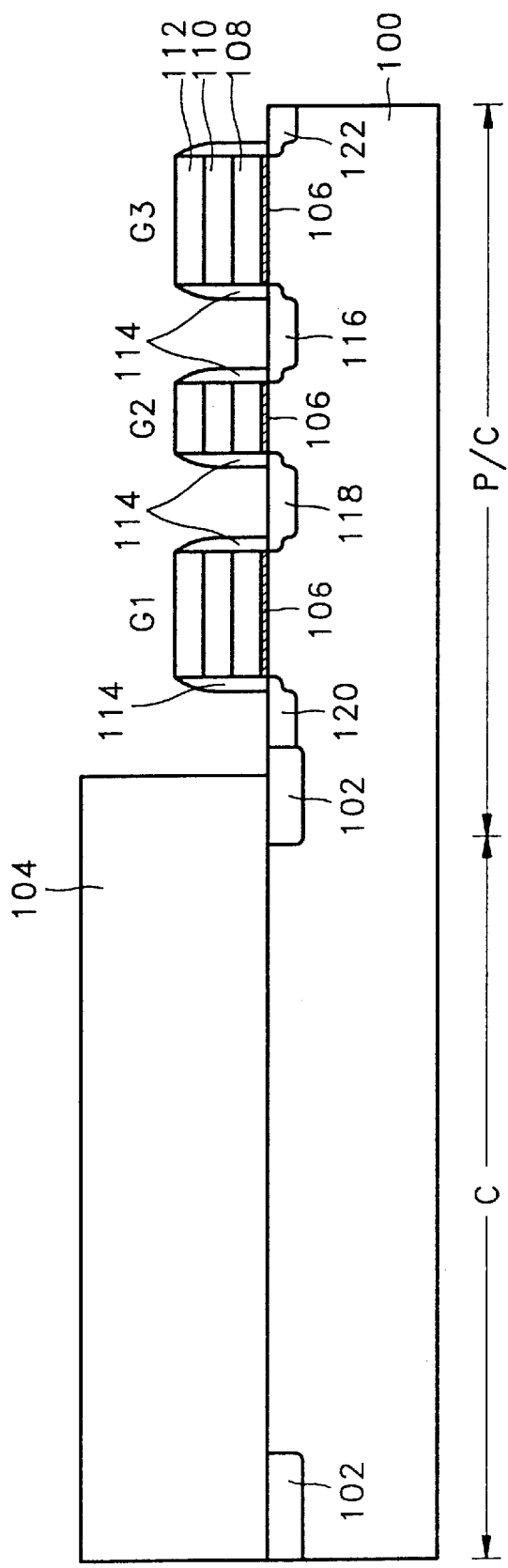

The present invention relates to a semiconductor memory device and a method for manufacturing the same, and more particularly, to a semiconductor memory device in which the characteristics of a plurality of unit elements having different geometrical structures, for example, transistors, are not deteriorated.

2. Description of the Related Art

As the integration density of semiconductor memory devices increases, the sizes of unit elements becomes smaller. In particular, as the size of a cell transistor is reduced, a short channel phenomenon occurs, in which a threshold voltage is reduced and leakage current increases. Accordingly, the dynamic refresh characteristics of a dynamic random access memory (DRAM) are deteriorated. In order to solve such problems, the concentration of impurities of a substrate is increased by implanting P-type (or N-type) impurity ions into the substrate before forming a gate electrode in an N-channel transistor (or a P-channel transistor) for increasing the threshold voltage.

Also, in order to form N-type (P-type) source and drain regions in the case of an N-channel transistor (or a P-channel transistor), the concentration of the impurities of the source and drain regions must be greater than the concentration of the channel region. As the size of the transistor is reduced, the concentration of impurities implanted by ion implantation for suppressing change in the threshold voltage must increase. Therefore, the difference between the concentration of the impurities of the source and drain regions of the transistor and the concentration of the impurities of the channel region is reduced as the integration density increases. Therefore, the resistance in a contact surface between the source and drain regions and the channel region increases. Accordingly, the operation speed of the transistor is reduced.

Furthermore, since the concentration of impurity ions for controlling the threshold voltage of the substrate (or a well formed in the substrate) increases as the integration density increases, leakage current that can flow from the source and drain regions to the substrate (or the well) increases. In order to solve such problems, an ion implantation technology by which an impurity region is partially formed only under the channel region of the transistor and not in the entire substrate in which the transistor is to be formed, using a reverse gate pattern, is disclosed in the U.S. Pat. No. 5,904,530 and Japanese Journal of Applied Physics; 1998, 1059.

It is most preferable to simultaneously form the transistors of the cell region of a semiconductor memory device and the transistors of a core circuit/peripheral circuit regions using the method disclosed in the above-mentioned publications in order to simplify manufacturing processes. Since all the transistors of the cell region constitute a part of a memory device, the lengths of all gates are equal. However, the transistors of the core circuit/peripheral circuit regions are designed to have different lengths depending on the purposes of the respective transistors, in which some transistors are used to constitute differential amplifiers and other transistors are used to constitute drivers. At this time, even though the thickness of a conductive material deposited for forming a gate is the same in the cell region and the core circuit/peripheral circuit regions, since it is determined whether or not to fill a trench depending on the width of the trench provided in an insulating layer or the thickness of the deposited material, the height of the gate differs in each region in a successive etch back process. It is possible to perform the etch back process in the core circuit/peripheral circuit regions separately from the etch back process in the cell region, in order to manufacture the gates of the core circuit/peripheral circuit regions as designed. Since the lengths of the gates of the transistors of the core circuit/peripheral circuit regions vary, although an etch back time is controlled in order to manufacture some gates as designed, the other gates are not manufactured as desired. It is possible to obtain the gates of the cell region and the core circuit/peripheral circuit regions as designed by performing etch back processes corresponding to the respective lengths of the gates of the core circuit/peripheral circuit regions. However, in this case, processes become complicated.

SUMMARY OF THE INVENTION

It is an object of the present invention to provide a semiconductor memory device having elements whose geometrical structures are different from each other, in which it is possible to maintain the characteristics of elements, for example, transistors formed in some regions, whose geometrical structures are different from other elements formed in other regions without deterioration of the characteristics of the other elements in other regions, and a method for manufacturing the same.

Accordingly, to achieve the above object, according to an aspect of the present invention, there is provided a first transistor comprised of a first gate, a first gate insulating film, a first source region, and a first drain region formed in a semiconductor substrate in core circuit/peripheral circuit regions of a semiconductor memory device having a cell region comprised of elements having a uniform standard, for example, a transistor (a second transistor) and the core circuit/peripheral circuit regions comprised of elements having various standards, for example, a transistor (a first transistor), a planarized interlayer dielectric film which covers the first transistor, and a second transistor formed in the cell region, comprising a second source region, a second drain region, a second gate having a height corresponding to the height of the interlayer dielectric film, and a second gate insulating film.

The second gate can be formed to be level with the interlayer dielectric film. When the height of the interlayer dielectric film increases, the height of the second gate also increases.

The first transistor further comprises a first spacer formed on the side wall of the first gate, the second gate of the second transistor is in the form of a concave lens, and the second transistor further comprises a second spacer formed on the side wall of the second gate. The second spacer is a first insulating film formed of a material having a high etch selectivity with respect to the interlayer dielectric film under a predetermined etchant. The interlayer dielectric film is a silicon nitride film, a silicon oxide film, a phosphosilicate glass (PSG) film, a borosilicate glass (BSG) film, a borophosphosilicate glass (BPSG) film, a tetraethylorthosilicate glass (TEOS) film, an ozone-TEOS film, an undopedsilicate glass (USG) film, or a combination of the above films and the first insulating film is the silicon nitride film, an aluminum oxide film, or a tantalum oxide film.

The second gate is formed of a polysilicon layer and a refractory metal layer and further comprises a second insulating film formed of a material having high etch selectivity with respect to the interlayer dielectric film formed on the refractory metal layer under a predetermined etchant. The second gate is formed of a polysilicon layer and a refractory metal layer and further comprises a second insulating film formed of a material having high etch selectivity with respect to the interlayer dielectric film formed on the refractory metal layer under a predetermined etchant.

The refractory metal layer is Co, W, Ta, Mo, or Ti. The refractory metal silicide layer is $CoSi_x$, $TiSi_x$, $TaSi_x$, $MoSi_x$, $WSi_x$, or $PtSi_x$. The second insulating film is the silicon nitride film, an aluminum oxide film, or a tantalum oxide film.

The first transistor further comprises a third insulating film formed on the top of the first gate and the second insulating film is thicker than the third insulating film. The thickness of the third insulating film is between 1500 and 2500 (Å).

In order to protect the semiconductor substrate and the first transistor, the semiconductor memory device further comprises a fourth insulating film, which is formed on the overall surface of the semiconductor substrate that belongs to the core circuit/peripheral circuit regions, in which the first transistor is formed, and has a high etch selectivity with respect to the interlayer dielectric film under a predetermined etchant. The semiconductor memory device further comprises a buffer film formed between the fourth insulating film and the semiconductor substrate that belongs to the core circuit/peripheral circuit regions. The fourth insulating film is the silicon nitride film, an aluminum oxide film, or a tantalum oxide film.

In order to suppress the leakage current of the second gate, the thickness of the second gate insulating film is equal to or greater than the thickness of the first gate insulating film. The first gate insulating film preferably has a thickness of between 30 and 60 Å and the second gate insulating film preferably has a thickness of between 40 and 70 Å.

In order to improve the characteristic of the transistor of a cell region, the second transistor further comprises an ion implantation region, which is formed in the semiconductor substrate under a second gate and into which impurity ions of the same conductive type of the semiconductor substrate are implanted or an ion implantation region, which is formed in the semiconductor substrate corresponding to the second spacer and into which impurity ions of the same conductive type of the semiconductor substrate are implanted.

According to another aspect of the present invention, in order to manufacture the semiconductor memory device having the cell region comprised of the elements having the uniform standard, for example, the transistor (the second transistor) and the core circuit/peripheral circuit regions comprised of the elements having various standards, for example, the transistor (the first transistor), a first transistor is formed in the semiconductor substrate that belongs to the core circuit/peripheral circuit regions. A planarized interlayer dielectric film is formed on the overall surface of the semiconductor substrate of a highly integrated semiconductor memory device, in which the first transistor is formed. A second transistor is formed in the cell region by a damascene method, using the interlayer dielectric film positioned in the cell region as the basis of reverse gate patterns.

In order to form the second transistor, reverse gate patterns and a first trench positioned between the reverse gate patterns are preferably formed by patterning the interlayer dielectric film positioned on the cell region. An impurity region for controlling a threshold voltage is preferably formed by implanting impurity ions into the first trench. A gate is preferably formed on the impurity region for controlling the threshold voltage by filling the first trench with a conductive material. A second trench is preferably formed by etching the reverse gate patterns. Source and drain regions are preferably formed by implanting impurity ions using the gate as a mask.

More preferably, spacers formed of a material having a high etch selectivity with respect to the interlayer dielectric film is formed under a predetermined etchant on the outside walls of the reverse gate patterns between the step of forming the first trench and the step of forming the threshold voltage controlling impurity region.

The interlayer dielectric film is a silicon oxide film, a silicon nitride film, a PSG film, a BSG film, a BPSG film, a TEOS film, an ozone-TEOS film, a PE-TEOS film, a USG film, or a combination of the above films and the spacer is formed of a material different from the material that forms the interlayer dielectric film and is the silicon nitride film, an aluminum oxide film, or a tantalum oxide film.

In order to protect the semiconductor substrate and the first transistor, an etching stop layer is formed of a material having a high etch selectivity with respect to the interlayer dielectric film under a predetermined etchant on the semiconductor substrate of the cell region and the core circuit/peripheral circuit regions, between the step of forming the first transistor and the step of forming the interlayer dielectric film. The etching stop layer is formed of a material that forms the interlayer dielectric film and is the silicon nitride film, an aluminum oxide film, or a tantalum oxide film. A buffer film formed of the silicon oxide film or the silicon oxinitride film is formed on the semiconductor substrate of the cell region and the core circuit/peripheral circuit regions between the step of forming the first transistor and the step of forming the etching stop layer.

The step of forming the gate of the transistor of the cell region will now be described. The gate is completed by forming a polysilicon layer, with which the first trench is filled to a first height of the first trench, and a refractory metal layer, with which the trench is filled from the first height to a second height. An insulating film, with which the first trench is filled from the second height to the top of the first trench and which is formed of a material having a high etch selectivity with respect to the interlayer dielectric film under a predetermined etchant, is formed. Another method for forming the gate includes the steps of forming a polysilicon layer, with which the first trench is filled to a first height of the first trench and forming a first refractory metal layer, with which the trench is filled from the first height to a second height. The gate is completed by changing some of the first refractory metal layer into a refractory metal silicide layer by silicide reaction. An insulating film, with which the first trench is filled from the second height to the top of the first trench and which is formed of a material having a high etch selectivity with respect to the interlayer dielectric film under a predetermined etchant, is formed. Another method for forming a gate electrode includes the steps of forming a polysilicon layer, with which the first trench is filled to a first height, forming a first refractory metal layer, with which the trench is filled from the first height to a second height, and changing all of the first refractory metal layer into a refractory metal silicide layer by silicide reaction. After completing the gate, an insulating film, with which the first trench is filled from the second height to the top of the first trench and which is formed of a material having a high etch selectivity with respect to the interlayer dielectric film under a predetermined etchant, is formed.

The refractory metal layer is Co, W, Ta, Mo, or Ti. The refractory metal silicide layer is $CoSi_x$, $TiSi_x$, $TaSi_x$, $MoSi_x$, $WSi_x$, or $PtSi_x$. The insulating film is formed of a material different from the material that forms the interlayer dielectric film and is the silicon nitride film, an aluminum oxide film, or a tantalum oxide film.

BRIEF DESCRIPTION OF THE DRAWING(S)

The above object and advantages of the present invention will become more apparent by describing in detail a preferred embodiment thereof with reference to the attached drawings in which:

FIGS. 1 through 10 are sectional views showing processes of a method for manufacturing a semiconductor memory device according to the present invention.

DESCRIPTION OF THE PREFERRED EMBODIMENT

The present invention will now be described more fully with reference to the accompanying drawings. In FIG. 1, an isolation region 102 is formed in a semiconductor substrate 100 in which a cell region C and core circuit/peripheral circuit regions P/C are to be formed. A plurality of isolation regions can be formed in order to insulate separate elements in the cell region C. The plurality of isolation regions can be formed in the core circuit/peripheral circuit regions P/C. However, in order to keep the illustration in FIG. 1 simple, only the isolation region 102 for separating the cell region C from the core circuit/peripheral circuit regions P/C is shown. A method of forming the isolation region 102 will now be described in detail. After forming a trench (not shown) in the semiconductor substrate 100, an oxide film is formed on the side wall of the trench and the trench is filled with an oxide film. The silicon trench isolation (STI) isolation region 102 is formed by planarizing the semiconductor substrate 100 by performing chemical and mechanical polishing. The isolation region 102 can be formed by local oxidation of silicon (LOCOS). The isolation region is preferably formed by the STI method in a highly integrated semiconductor device.

An ion implantation process for forming an N well and/or a P well is performed in the cell region C and the core circuit/peripheral circuit regions P/C (not shown). A mask 104 for blocking the cell region C is formed. A common ion implantation process for controlling the threshold voltage of a transistor is performed on the entire semiconductor substrate of the core circuit/peripheral circuit regions P/C (not shown).

As shown in FIG. 1, a transistor is formed in the core circuit/peripheral circuit regions P/C. First, an oxide film 106 is formed to a thickness of between 30 and 60 Å as a gate insulating film. Gates G1, G2, and G3 are formed of a polysilicon layer pattern 108, a metal silicide layer pattern 110, and an insulating film pattern 112 by sequentially forming a polysilicon layer of between 500 and 1500 Å, a metal silicide layer of between 500 and 1500 Å, and an insulating film of between 1000 and 3000 Å on the gate oxide film 106 and patterning the polysilicon layer, the metal silicide layer, and the insulating layer. The metal silicide layer is formed of $CoSi_x$, $TiSi_x$, $TaSi_x$, $MoSi_x$, $WSi_x$, or $PtSi_x$. A Silicon nitride film or a silicon nitride oxide film can be used as the insulating film. A refractory metal layer can be used instead of the metal silicide layer. The refractory metal layer can be formed of Co, W, Ta, Mo, or Ti. An impurity region is formed by performing the ion implantation process for forming source and drain regions having low density after forming the gate.

A spacer 114 is formed on the outside wall of the gates G1, G2, and G3 to a thickness of between 300 and 1000 Å by forming the silicon oxide film or the silicon nitride film on the entire surface of the core circuit/peripheral circuit regions P/C in which the gates G1, G2, and G3 are formed, and performing an etch back process. Source and drain regions 116, 118, 120, and 122 having a lightly doped drain and source (LDD) structure are formed by performing the ion implantation process for forming source and drain regions having a high concentration. The source and drain regions can have a double doped drain and source (DDD) structure.

Though not shown, then, the mask 104 formed on the cell region C is removed.

Figure 2:
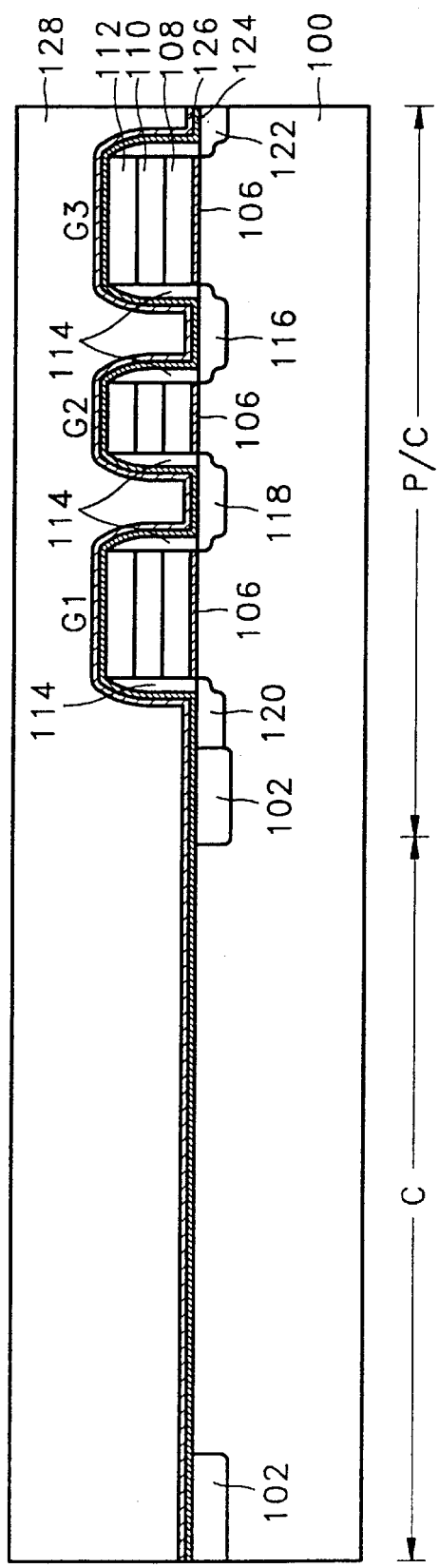

In FIG. 2, a buffer layer 124 of between 50 and 100 Å, an etching stop layer 126 of between 50 and 150 Å, and an interlayer dielectric film 128 of between 2200 and 6500 Å are sequentially formed on the entire surface of the cell region C and the core circuit/peripheral circuit regions P/C. The buffer layer 124, which is formed of the silicon oxide film or the silicon oxinitride film, strengthens the adhesion between the semiconductor substrate 100 and the etching stop layer 126. When the etch stopping layer 126 is formed of a material having a high etch selectivity with respect to the interlayer dielectric film under a predetermined etchant, the trench that exposes the source and drain regions 116, 118, 120, or 122 of the core circuit/peripheral circuit regions P/C can be formed in a self-alignment method. In order to perform the above-mentioned function, the etching stop layer 126 can be formed of the silicon nitride film, an aluminum oxide film, or a tantalum oxide film. The interlayer dielectric film is formed of a material different from the material that forms the etching stop layer 126. The interlayer dielectric film can be formed of a silicon oxide film, a silicon nitride film, a phosphosilicate glass (PSG) film, a borosilicate glass (BSG) film, a borophosphosilicate glass (BPSG) film, a tetraethylorthosilicate glass (TEOS) film, an ozone-TEOS film, a PE-TEOS film, or an undoped silicate glass (USG) film, or a combination of the above films. A planarized interlayer dielectric film 128 is formed by performing chemical and mechanical polishing on the interlayer dielectric film.

Figure 3:
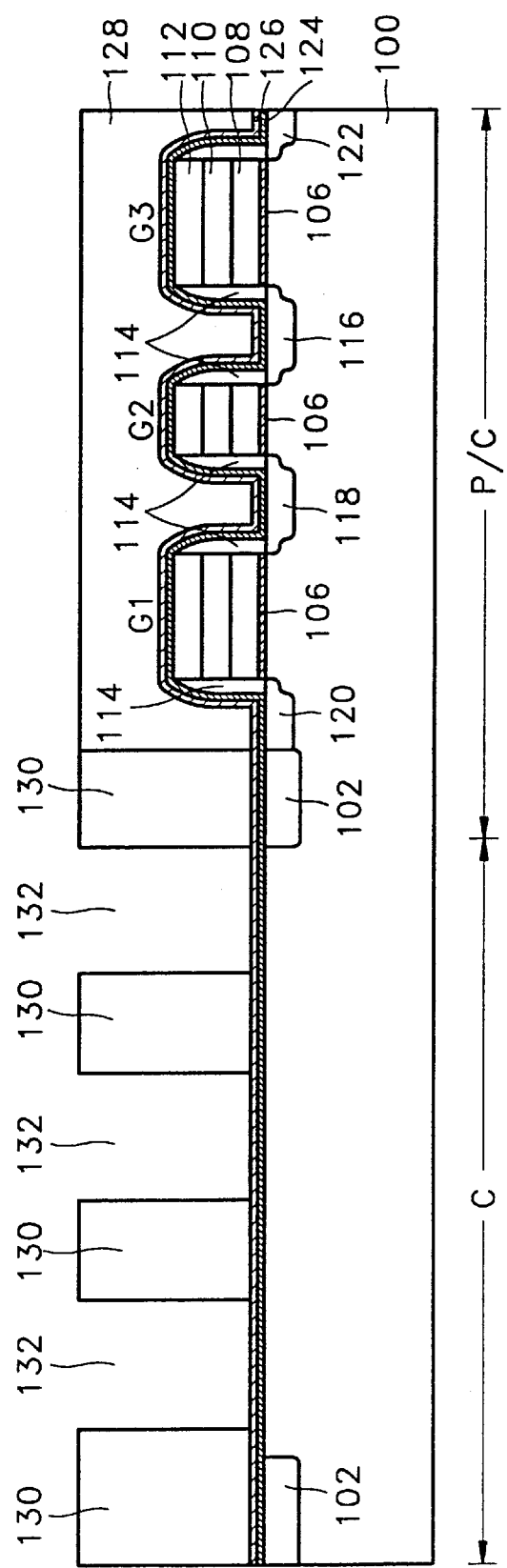

In FIGS. 3 through 8, transistors including a gate are formed in the cell region C using a damascene method. In FIG. 3, reverse gate patterns 130 and first trenches 132 arranged therebetween are formed by patterning and etching the interlayer dielectric film 128 in the cell region C until the etching stop layer 126 thereunder is exposed. The etching stop layer 126 prevents the semiconductor substrate 100 from being damaged when the first trenches 132 are formed in the cell region C and prevents the impurities generated when the interlayer dielectric film 128 is formed from permeating the gates G1, G2, and G3 in the core circuit/peripheral circuit regions P/C. The gates of the transistors of the cell region are formed in the first trenches 132. The height of the gate of the transistors of the cell region C is determined by the height of the reverse gate pattern 130, that is, the height of the interlayer dielectric film 128.

Figure 4:
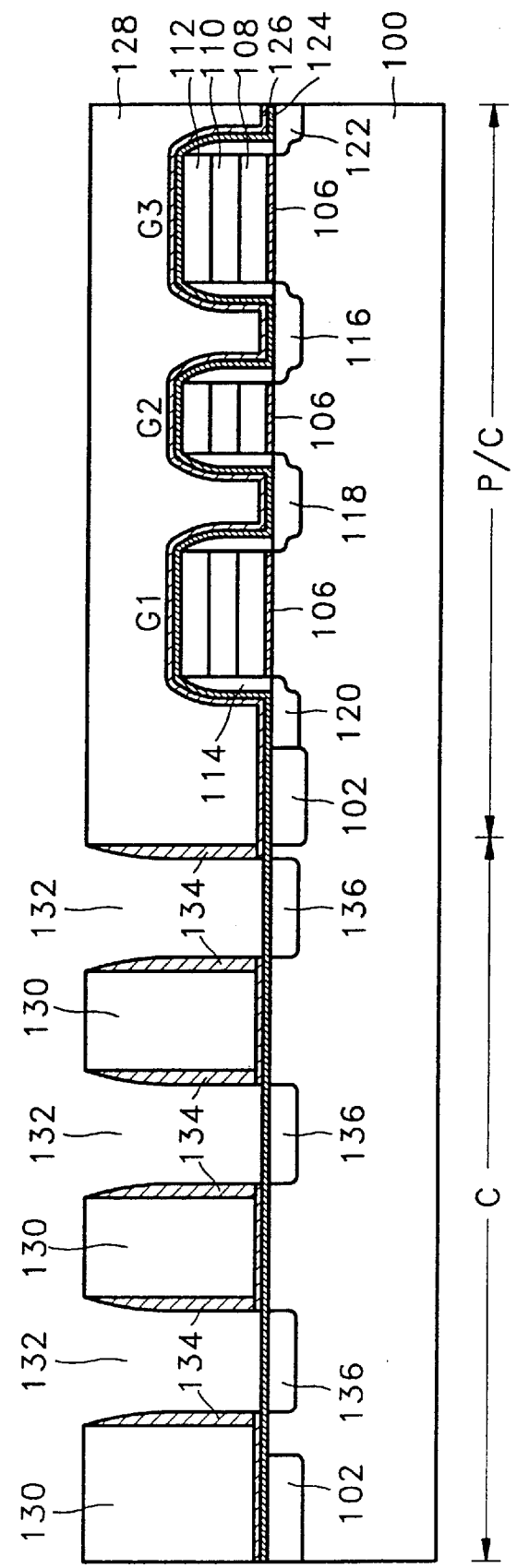

In FIG. 4, spacers 134 of between 200 through 700 Å are formed on the outside walls (or the inside walls of the first trenches 132) by performing the etch back process after coating an insulating film on the entire surface of the cell region C and the core circuit/peripheral circuit regions P/C. The silicon nitride film in the first trenches 132 is removed when over-etching is performed during the etch back process. Impurity regions 136 are formed in the semiconductor substrate 100 between the spacers 134 by performing the ion implantation process for controlling the threshold voltage of the transistor of the cell region C. It is possible to perform a partial ion implantation process for controlling the threshold voltage after forming the reverse gate patterns 130 and the first trenches 132 without forming the spacers 134.

It is possible to further improve the transistor refresh characteristic of the cell region C more by performing the partial ion implantation process after forming the spacers 134 than in a case where the partial ion implantation process for controlling the threshold voltage is performed in a state where the spacers 134 do not exist.

When the spacer 134 is formed of an insulating material having high selectivity with respect to the interlayer dielectric film under a predetermined etchant, a trench, in which a bit line contact pad or a storage electrode contact pad is to be formed, can be formed in the self-align manner after forming the transistors of the cell region C. The material film having high etch selectivity with respect to the interlayer dielectric film is the same as a material film that forms the above-mentioned etching stop layer 126 such as the silicon nitride film, the aluminum oxide film, or the tantalum oxide film.

Figure 5:
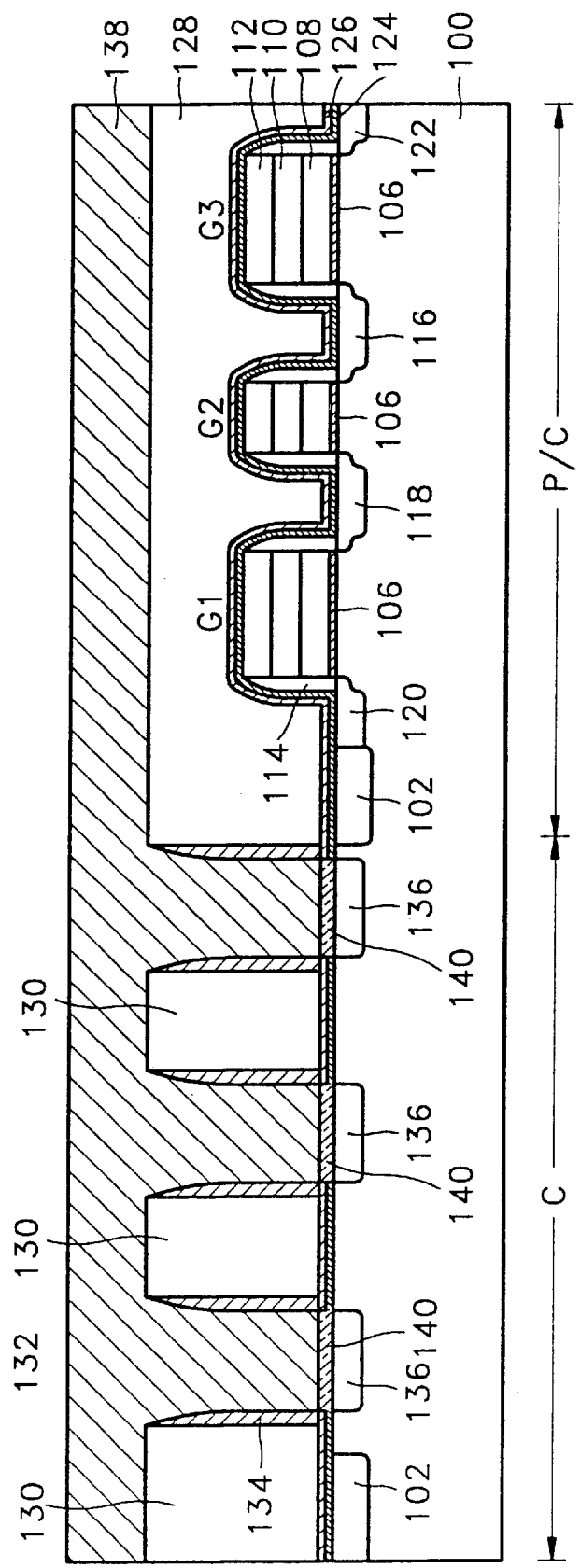

In FIG. 5, agate oxide film 140 of the cell region C is grown after removing the buffer film 124 formed in the first trenches 132. Since the gate oxide film 140 of the cell region C is separately formed from the gate oxide film 106 of the transistor formed in the core circuit/peripheral circuit regions P/C, it is possible to grow the gate oxide film 140 to a thickness which is suitable for the characteristic of the transistor of the cell region C. In general, since the voltage applied to the gate of the transistor of the cell region C is twice as great as the voltage applied to the gate of the transistor of the core circuit/peripheral circuit regions P/C, the thickness of the gate oxide film 140 of the transistor of the cell region C is preferably larger than the thickness of the gate oxide film 106 of the core circuit/peripheral circuit regions P/C. In general, while the thickness of the gate oxide film 106 of the transistor of the core circuit/peripheral circuit regions P/C is between 30 and 60 Å, the thickness of the gate oxide film 140 of the transistor of the cell region C can be formed to a thickness between 40 and 70 Å.

The first trenches 132 are filled with an N+ doped polysilicon layer 138, which is formed on the entire surface of the cell region C and the core circuit/peripheral circuit regions P/C.

Figure 6:
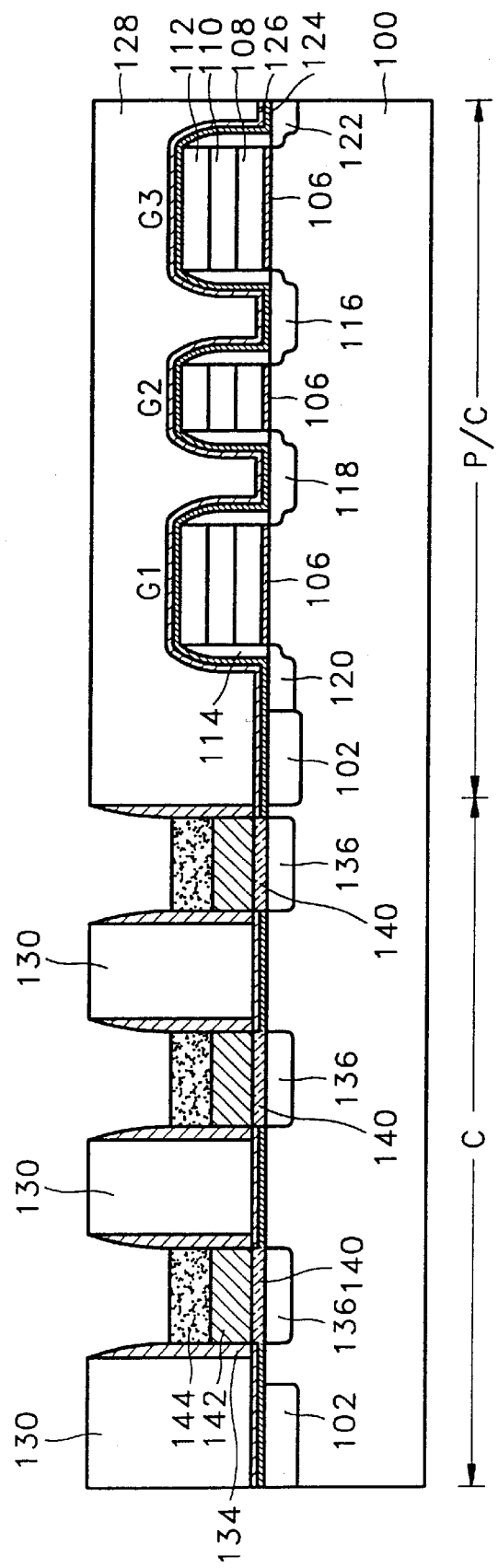

As shown in FIG. 6, a polysilicon layer pattern 142 is formed to a thickness of between 500 and 3000 Å from the bottom of the first trench 132 by chemical and mechanical polishing and etching back the N+ doped polysilicon layer 138. When the N+ doped polysilicon layer 138 is formed to partially fill the trench 132, it is possible to use only etch back process.

A refractory metal is formed on the polysilicon layer pattern 142 using a sputtering or chemical vapor deposition (CVD) method. A refractory metal silicide pattern 144 is formed to a thickness between 300 and 800 Å by performing a thermal process of the refractory metal. Depending on the thermal process conditions, all or some of the refractory metal layer may be changed into the metal silicide pattern. In the present embodiment, all of the refractory metal layer is changed into the metal silicide pattern. The refractory metal left after a silicide reaction is selectively removed using chemicals such as sulphuric acid and $H_2O_2$. Alternatively, it is possible to form a refractory metal layer (not shown) to a thickness of between 500 and 2000 Å on the entire surface of the cell region C using the CVD method instead of the metal silicide layer 144.

The metal composing the refractory metal layer can be made of Co, W, Ta, Mo, or Ti. The refractory metal silicide pattern 144 can be made of $CoSi_x$, $TiSi_x$, $TaSi_x$, $MoSi_x$, $WSi_x$, or $PtSi_x$.

The refractory metal layer is etched back. Accordingly, a refractory metal layer pattern (not shown) is formed to a thickness between 300 and 700 Å. When the refractory metal layer is formed to completely fill the first trenches, the etch back process can be performed together with the chemical and mechanical polishing.

Figure 7:
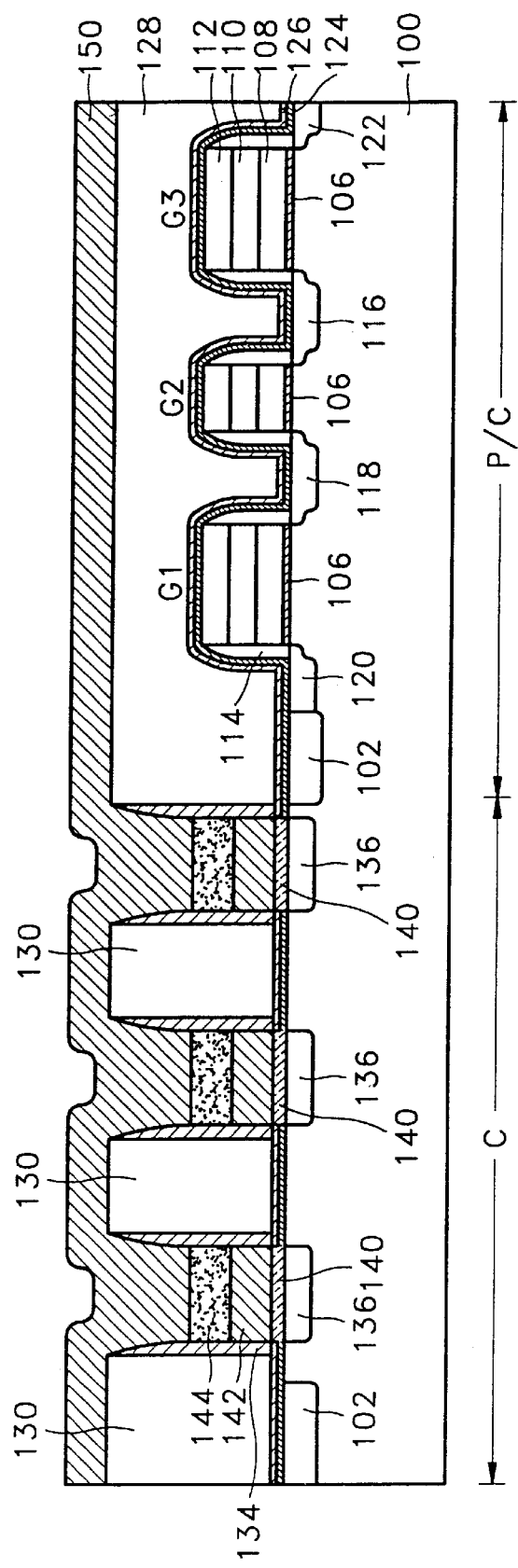

In FIG. 7, an insulating film 150 having a high etch selectivity with respect to the inerlayer dielectric film 128 under a predetermined etchant is formed on the entire surface of the resultant structure in which the metal silicide pattern 144 or the refractory metal layer pattern is formed, using the CVD method. The insulating film 150 is formed of a material that is different from the material that forms the interlayer dielectric film 128. The insulating film 150 is made of a silicon nitride film, an aluminum oxide film, or a tantalum oxide film.

Figure 8:
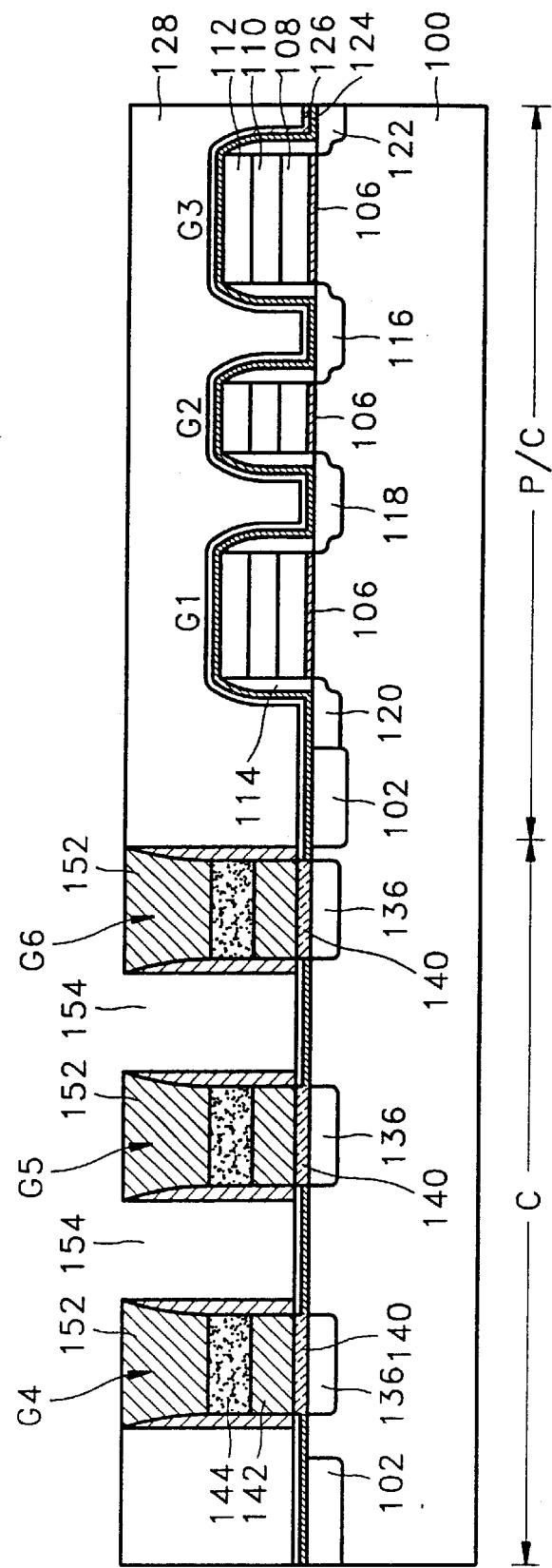

In FIG. 8, insulating film patterns 152 are formed to a thickness of between 1500 and 2500 Å by etching back or chemically and mechanically polishing the insulating film 150. Therefore, gates G4, G5, and G6 of the cell region, which are formed of the doped polysilicon layer patterns 142, the refractory silicide layer patterns 144, and the insulating film patterns 152 in the form of a concave shaped lens, are manufactured. It is possible to form a gate including a refractory metal layer (not shown) instead of the refractory silicide layer pattern 144. The above-mentioned spacers 134 are formed on the side walls of the gates of the cell region.

In a conventional technology, after forming the gates of the cell region C, the gates are covered with an interlayer dielectric film. Therefore, as integration density increases, it is difficult to fill the spaces between the gates with the interlayer dielectric film without the formation of voids due to the increase in the aspect ratio of the gate. However, in the present invention, the gates G4, G5, and G6 of the cell region C are formed by patterning the interlayer dielectric film 128 that belongs to the cell region C to form reverse gate patterns, and filling spaces between the reverse gate patterns with the material of which the gate is to be formed. Here, in order to increase the height of the gate, after forming the transistor of the core circuit/peripheral circuit regions P/C, the interlayer dielectric film 128 formed on the entire surface of the semiconductor substrate 100 is formed to be thick. Therefore, it is not necessary to fill the spaces between the gates with the interlayer dielectric film.

The reverse gate pattern (130 of FIG. 7) is etched until the etching stop layer 126 formed on the semiconductor substrate 100 is exposed using a photolithography process. Since the insulating film patterns 152 and the spacer 134 of the gates G4, G5, and G6 are formed of a material having a high etch selectivity with respect to the material that forms the reverse gate pattern (130 of FIG. 7) under a predetermined etchant, it is possible to form second trenches 154 in the self-align manner.

Figure 9:
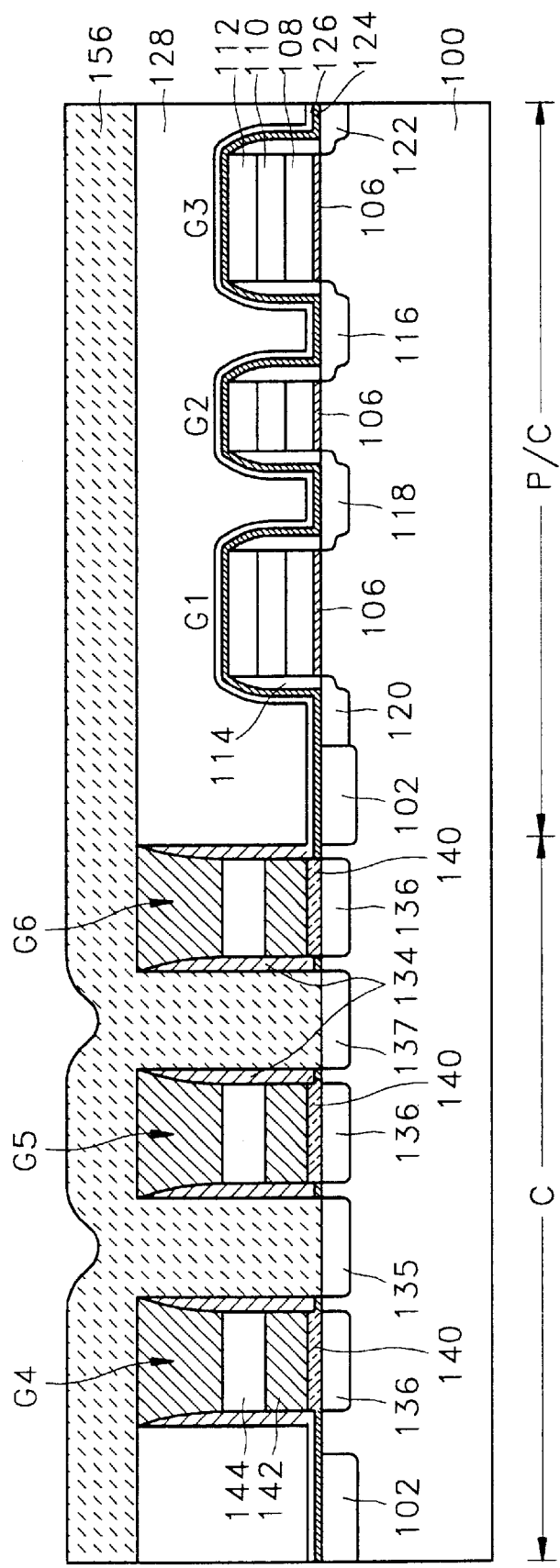

In FIG. 9, after removing the etching stop layer 126 located at the bottom of the second trenches 154 and the buffer film 124 under the etching stop layer 126, the substrate is subjected to cleaning. Source and drain regions 135 and 137 of the transistor are formed by performing an ion implantation process using the gates G4, G5, and G6 and the spacers 134 as masks after forming the second trenches 154. Due to the spacers 134 formed on the side walls of the gates G4, G5, and G6, the source and drain regions 135 and 137 are formed to be separate from the threshold voltage controlling impurity regions 136. When the spacers 134 are not formed, contact surfaces are formed between the threshold voltage controlling impurity regions 136 and the source and drain regions 135 and 137.

A polysilicon layer 156 is formed on the entire surface of the semiconductor substrate 100 so as to fill the second trenches.

Figure 10:
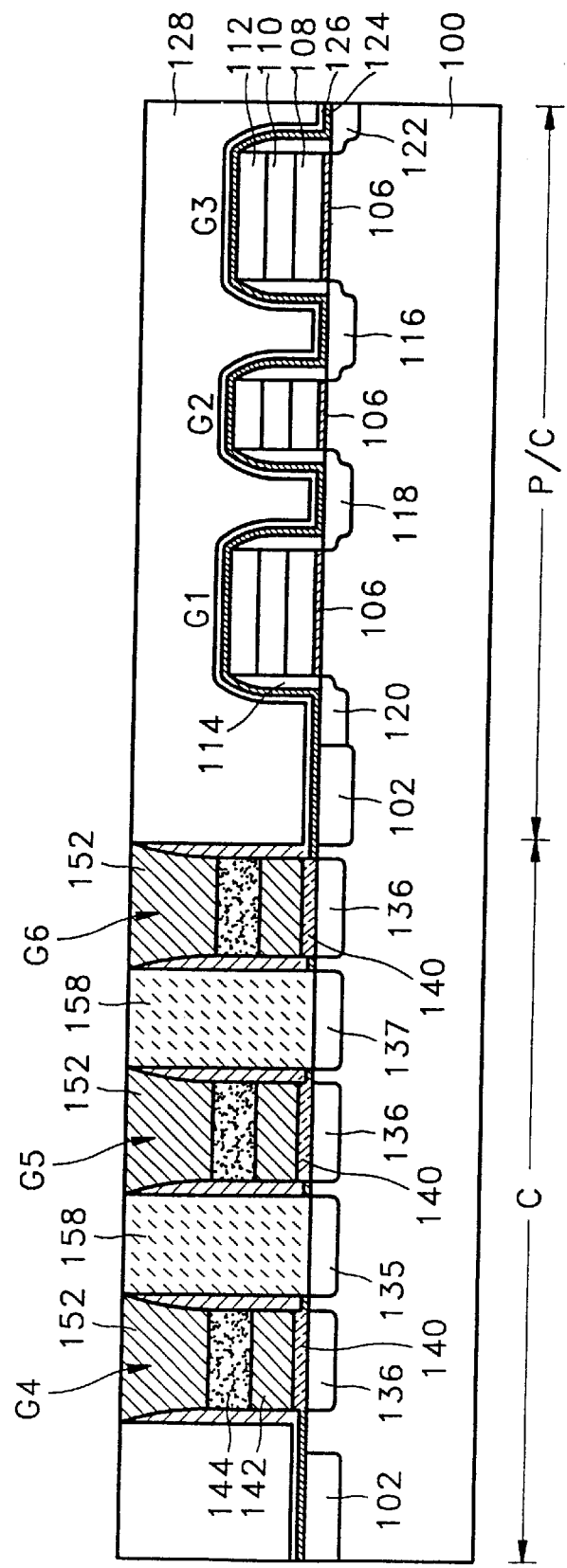

In FIG. 10, contact pads 158 are formed by chemically and mechanically polishing the polysilicon layer (156 of FIG. 9) until the insulating film patterns 152 of the gates G4, G5, and G6 are exposed. Some of the contact pads 158 are directly connected to a bit line (not shown) and the others are connected to the storage electrode (not shown) of the capacitor formed on the bit line (not shown).

Thereafter processes of forming an interlayer dielectric film, forming a plug for connecting a bit line, forming a bit line, forming an interlayer dielectric film, forming a plug for connecting a capacitor storage electrode, and forming a capacitor, which are used in conventional semiconductor memory device manufacturing processes, are performed.

The present invention was described with respect to the semiconductor memory device having a capacitor over bit line (COB) structure, however, it can be applied to a semiconductor memory device having a capacitor under bit line (CUB) structure. Namely, after forming the bit line of the semiconductor substrates of the cell region C and the core circuit/peripheral circuit regions P/C, transistors are formed in the semiconductor substrate of the core circuit/peripheral circuit regions P/C by a conventional method. An interlayer dielectric film is formed on the entire semiconductor substrate including the resultant, that is, on the entire surface of the substrate of the core circuit/peripheral circuit regions P/C. Reverse gate patterns are formed by patterning the interlayer dielectric film belong to the cell region C. The transistor formed in the cell region is manufactured by forming a gate by filling trenches between the reverse gate patterns with a conductive material, removing the reverse gate patterns, and forming source and drain regions.

The partial ion implantation process for increasing the threshold voltage and securing the refresh characteristic of the semiconductor memory device and a contact hole self-alignment etching process for connecting the bit line to the substrate and the substrate to the capacitor can be applied to the semiconductor memory device of the CUB structure.

The advantages of the present invention, which were described above, will now be summarized.

First, elements such as the transistors of the core circuit/peripheral circuit regions P/C, which have various specifications, are formed using a common method that is used in a conventional technology. The interlayer dielectric film is formed on the entire surface of the substrate including the transistor devices of the core circuit/peripheral circuit regions P/C, which have various specifications. Then, transistor devices, which have uniform specifications and for which a fine control is required for maintaining the characteristics thereof, are formed using a damascene method on the basis of the reverse gate patterns. Therefore, it is possible to manufacture the transistor devices formed in all regions with their characteristics when designed maintained at the highest degree.

Second, since the height of the transistor element of the cell region is determined depending on the height of the previously existing interlayer dielectric film, it is not necessary to fill the spaces between the gates of the transistor with the insulating material after forming the transistor, which is required in the conventional technology.

Third, it is possible to form the insulating film (152 of FIG. 10) positioned on the top of the gates of the transistor, which have a uniform specification, to be thick in order to perform a self-alignment contact process by increasing the thickness of the interlayer dielectric film. Therefore, it is possible to increase an alignment process margin when the trenches 154 are formed later.

Fourth, it is possible to increase the threshold voltage of the transistor of the cell region and to improve the refresh characteristics by forming spacers on the side walls of the gates in the form of a concave lens of the transistor of the cell region, thus forming the impurity region for controlling the threshold voltage to be separate from the source and drain regions in the channel regions.

Fifth, since it is possible to separately grow the gate oxide film of the transistor of the cell region regardless of the formation of the gate oxide film of the core circuit/peripheral circuit regions P/C, the gate oxide film of the transistor of the cell region can be thicker than the gate oxide film of the core circuit/peripheral circuit regions P/C. Therefore, it is obtained to reduce leakage current which is generated as the gate oxide film becomes thinner.

What is claimed is:

1. A semiconductor memory device comprising:
a semiconductor substrate having a cell region and a core circuit/peripheral circuit region;
a first transistor comprising a first stacked gate, a first stacked gate insulating film, a first source region, and a first drain region formed in the core circuit/peripheral circuit region, the first stacked gate having straight side walls and a first spacer therearound;
a planarized interlayer dielectric film which covers the first transistor; and
a second transistor formed in the cell region, comprising a second source region, a second drain region, a gate stack of the second transistor having concave-shaped side walls and a second spacer therearound and further having a height substantially identical to the height of the interlayer dielectric film, and a second stacked gate insulating film.

2. The semiconductor memory device of claim 1, wherein the first spacer includes a straight inner surface and a convex outer surface and wherein the second spacer includes a concave inner surface and a straight outer surface.

3. The semiconductor memory device of claim 2, wherein the second spacer is a first insulating film formed of a material having a high etch selectivity with respect to the interlayer dielectric film when exposed to a predetermined etchant.

4. The semiconductor memory device of claim 3, wherein the interlayer dielectric film is one selected from the group consisting of a silicon nitride film, a silicon oxide film, a phosphosilicate glass (PSG) film, a borosilicate glass (BSG) film, a borophosphosilicate glass (BPSG) film, a tetraethylorthosilicate glass (TEOS) film, an ozone-TEOS film, an undopedsilicate glass (USG) film, and a combination of the above films, and wherein the first insulating film is one selected from the group consisting of the silicon nitride film, an aluminum oxide film, and a tantalum oxide film.

5. The semiconductor memory device of claim 2, wherein the second spacer is formed of a material having a high etch selectivity with respect to the interlayer dielectric film when exposed to a predetermined etchant.

6. The semiconductor memory device of claim 1, wherein the gate stack of the second transistor is formed of a polysilicon layer and a refractory metal layer and further comprises a second insulating film formed of a material having high etch selectivity with respect to the interlayer dielectric film formed on the refractory metal layer when exposed to a predetermined etchant.

7. The semiconductor memory device of claim 1, wherein the gate stack of the second transistor comprises a polysilicon layer and a refractory metal silicide layer.

8. The semiconductor memory device of claim 1, wherein the gate stack of the second transistor comprises a polysilicon layer and a refractory metal layer.

9. The semiconductor memory device of claim 1, wherein the gate stack of the second transistor is formed of a polysilicon layer and a refractory metal silicide layer and further comprises a second insulating film formed of a material having a high selectivity with respect to the interlayerdielectric film formed on the refractory metal silicide layer when exposed to a predetermined etchant.

10. The semiconductor memory device of claim 9, wherein the refractory metal silicide layer is one selected from the group consisting of $CoSi_x$, $TiSi_x$, $TaSi_x$, $MoSi_x$, $WSi_x$, and $PtSi_x$.

11. The semiconductor memory device of claim 9, wherein the refractory metal silicide layer is one selected from the group consisting of $CoSi_x$, $TiSi_x$, $TaSi_x$, $MoSi_x$, $WSi_x$, and $PtSi_x$ and wherein the second insulating film is one selected from the group consisting of a silicon nitride film, an aluminum oxide film, and a tantalum oxide film.

12. The semiconductor memory device of claim 9, wherein the interlayer dielectric film is one selected from the group consisting of a silicon nitride film, a silicon oxide film, a PSG film, a BSG film, a BPSG film, a TEOS film, an ozone-TEOS film, a USG film, and wherein a combination of the above films and the second insulating film is one selected from the group consisting of the silicon nitride film, an aluminum oxide film, and a tantalum oxide film.

13. The semiconductor memory device of claim 9, wherein the first transistor further comprises a third insulating film formed on the top of the first stacked gate and the second insulating film is thicker than the third insulating film.

14. The semiconductor memory device of claim 13, wherein the thickness of the third insulating film is between approximately 1500 and 2500 Å.

15. The semiconductor memory device of claim 1, further comprising a fourth insulating film that is formed on the overall surface of the semiconductor substrate that belongs to the core circuit/peripheral circuit regions, in which the first transistor is formed, the fourth insulating film having a high etch selectivity with respect to the interlayer dielectric film when exposed to a predetermined etchant.

16. The semiconductor memory device of claim 15, further comprising a buffer film formed between the fourth insulating film and the semiconductor substrate in the core circuit/peripheral circuit regions.

17. The semiconductor memory device of claim 16, wherein the interlayer dielectric film is one selected from the group consisting of a silicon nitride film, a silicon oxide film, a PSG film, a BSG film, a BPSG film, a TEOS film, an ozone-TEOS film, an USG film, and a combination of the above films, wherein the fourth insulating film is one selected from the group consisting of the silicon nitride film, an aluminum oxide film, and a tantalum oxide film, and wherein the buffer film is one selected from the group consisting of the silicon oxide film and a silicon oxynitride film.

18. The semiconductor memory device of claim 15, wherein the interlayer dielectric film is one selected from the group consisting of a silicon nitride film, a silicon oxide film, a PSG film, a BSG film, a BPSG film, a TEOS film, an ozone-TEOS film, an USG film, and a combination of the above films, and wherein the fourth insulating film is one selected from the group consisting of the silicon nitride film, an aluminum oxide film, and a tantalum oxide film.

19. The semiconductor memory device of claim 1, wherein the thickness of the gate stack insulating film of the second transistor is equal to or greater than the thickness of the first gate insulating film.

20. The semiconductor memory device of claim 24, wherein the first gate insulating film has a thickness of between approximately 30 and 60 Å.

* * * * *

UNITED STATES PATENT AND TRADEMARK OFFICE
CERTIFICATE OF CORRECTION

| | |
|---|---|
| PATENT NO. | : 6,600,187 B2 |
| APPLICATION NO. | : 09/916736 |
| DATED | : July 29, 2003 |
| INVENTOR(S) | : Jeong-Seok Kim |

It is certified that error appears in the above-identified patent and that said Letters Patent is hereby corrected as shown below:

Column 7, line 23, the word "agate" should read -- a gate --;

Replace the existing claims with the following

1. A semiconductor memory device comprising:
a semiconductor substrate having a memory cell region and a core circuit/peripheral circuit region;
a first transistor formed in the core circuit/peripheral circuit region, comprising a first gate stack, a first gate insulating film, a first source region, and a first drain region, the first gate stack having straight side walls and disposed between a first pair of spacers;
a planarized interlayer dielectric film which covers the first transistor; and
a second transistor formed in the memory cell region, comprising a second source region, a second drain region, a second gate insulating film, and a second gate stack having concave-shaped side walls and disposed between a second pair of spacers, said second gate stack and said second pair of spacers having a height substantially identical to the height of the interlayer dielectric film;
an insulating cap layer in said second gate stack;
an etch stop layer between said first transistor and said interlayer dielectric film, a portion of said etch stop layer extending into said memory cell region and underlying said second pair of spacers in said memory cell region,
wherein the second transistor further comprises an ion implantation region formed in the semiconductor substrate under said second gate stack, with impurity ions of the same conductive type of the semiconductor substrate being implanted into said ion implantation region.

2. The semiconductor memory device of claim 1, wherein each spacer in the first pair of spacers includes a straight inner surface and a convex outer surface,

UNITED STATES PATENT AND TRADEMARK OFFICE
CERTIFICATE OF CORRECTION

| | |
|---|---|
| PATENT NO. | : 6,600,187 B2 |
| APPLICATION NO. | : 09/916736 |
| DATED | : July 29, 2003 |
| INVENTOR(S) | : Jeong-Seok Kim |

It is certified that error appears in the above-identified patent and that said Letters Patent is hereby corrected as shown below:

and wherein each spacer in the second pair of spacers includes a concave inner surface and a straight outer surface.

3. The semiconductor memory device of claim 2, wherein said each spacer in the second pair of spacers is a first insulating film formed of a material having a high etch selectivity with respect to the interlayer dielectric film when exposed to a predetermined etchant.

4. The semiconductor memory device of claim 4, wherein the interlayer dielectric film is one selected from the group consisting of a silicon nitride film, a silicon oxide film, a phosphosilicate glass (PSG) film, a borosilicate glass (BSG) film, a borophosphosilicate glass (BPSG) film, a tetraethylorthosilicate glass (TEOS) film, an ozone-TEOS film, an undoped silicate glass (USG) film, and a combination of the above films, and wherein the first insulating film is one selected from the group consisting of a silicon nitride film, an aluminum oxide film, and a tantalum oxide film.

5. The semiconductor memory device of claim 2, wherein said each spacer in the second pair of spacers is formed of a material having a high etch selectivity with respect to the interlayer dielectric film when exposed to a predetermined etchant.

6. The semiconductor memory device of claim 1, wherein the second gate stack is formed of a polysilicon layer, a refractory metal layer and said insulating cap layer, wherein said insulating cap layer is formed on the refractory metal layer and is formed of a material having a high etch selectivity with respect to the interlayer dielectric film when exposed to a predetermined etchant.

7. The semiconductor memory device of claim 1, wherein the second gate stack further comprises a polysilicon layer and a refractory metal silicide layer.

UNITED STATES PATENT AND TRADEMARK OFFICE
CERTIFICATE OF CORRECTION

| | |
|---|---|
| PATENT NO. | : 6,600,187 B2 |
| APPLICATION NO. | : 09/916736 |
| DATED | : July 29, 2003 |
| INVENTOR(S) | : Jeong-Seok Kim |

It is certified that error appears in the above-identified patent and that said Letters Patent is hereby corrected as shown below:

8. The semiconductor memory device of claim 1, wherein the second gate stack further comprises a polysilicon layer and a refractory metal layer.

9. The semiconductor memory device of claim 1, wherein the second gate stack is formed of a polysilicon layer, a refractory metal silicide layer and said insulating cap layer, wherein said insulating cap layer is formed on the refractory metal silicide layer and is formed of a material having a high etch selectivity with respect to the interlayer dielectric film when exposed to a predetermined etchant.

10. The semiconductor memory device of claim 9, wherein the refractory metal silicide layer is one selected from the group consisting of $CoSi_x$, $TiSi_x$, $TaSi_x$, $MoSi_x$, $WSi_x$, and $PtSi_x$.

11. The semiconductor memory device of claim 9, wherein the refractory metal silicide layer is one selected from the group consisting of $CoSi_x$, $TiSi_x$, $TaSi_x$, $MoSi_x$, $WSi_x$, and $PtSi_x$, and wherein the insulating cap layer is one selected from the group consisting of a silicon nitride film, an aluminum oxide film, and a tantalum oxide film.

12. The semiconductor memory device of claim 9, wherein the interlayer dielectric film is one selected from the group consisting of a silicon nitride film, a silicon oxide film, a PSG film, a BSG film, a BPSG film, a TEOS film, an ozone-TEOS film, a USG film, and a combination of the above films, and wherein the insulating cap layer is one selected from the group consisting of a silicon nitride film, an aluminum oxide film, and a tantalum oxide film.

UNITED STATES PATENT AND TRADEMARK OFFICE
CERTIFICATE OF CORRECTION

| | | |
|---|---|---|
| PATENT NO. | : 6,600,187 B2 | |
| APPLICATION NO. | : 09/916736 | |
| DATED | : July 29, 2003 | |
| INVENTOR(S) | : Jeong-Seok Kim | |

It is certified that error appears in the above-identified patent and that said Letters Patent is hereby corrected as shown below:

13. The semiconductor memory device of claim 9, wherein the first transistor further comprises a third insulating film formed on the top of the first gate stack, and the insulating cap layer is thicker than the third insulating film.

14. The semiconductor memory device of claim 13, wherein the thickness of the third insulating film is between approximately 1500Å and 2500Å.

15. The semiconductor memory device of claim 1, wherein said insulating cap layer has a high etch selectivity with respect to the interlayer dielectric film when exposed to a predetermined etchant.

16. The semiconductor memory device of claim 15, further comprising a buffer film formed between the etch stop layer and the semiconductor substrate in the core circuit/peripheral circuit region.

17. The semiconductor memory device of claim 16, wherein the interlayer dielectric film is one selected from the group consisting of a silicon nitride film, a silicon oxide film, a PSG film, a BSG film, a BPSG film, a TEOS film, an ozone-TEOS film, an USG film, and a combination of the above films, wherein the etch stop layer is one selected from the group consisting of a silicon nitride film, an aluminum oxide film, and a tantalum oxide film, and wherein the buffer film is one selected from the group consisting of a silicon oxide film and a silicon oxynitride film.

18. The semiconductor memory device of claim 15, wherein the interlayer dielectric film is one selected from the group consisting of a silicon nitride film, a silicon oxide film, a PSG film, a BSG film, a BPSG film, a TEOS film, an ozone-TEOS film, an USG film, and a combination of the above films, and wherein the etch stop

UNITED STATES PATENT AND TRADEMARK OFFICE
CERTIFICATE OF CORRECTION

| | |
|---|---|
| PATENT NO. | : 6,600,187 B2 |
| APPLICATION NO. | : 09/916736 |
| DATED | : July 29, 2003 |
| INVENTOR(S) | : Jeong-Seok Kim |

It is certified that error appears in the above-identified patent and that said Letters Patent is hereby corrected as shown below:

layer is one selected from the group consisting of the silicon nitride film, an aluminum oxide film, and a tantalum oxide film.

19. The semiconductor memory device of claim 1, wherein the thickness of the second gate insulating film is equal to or greater than the thickness of the first gate insulating film.

20. The semiconductor memory device of claim 20, wherein the first gate insulating film has a thickness of between approximately 30Å and 60Å.

Signed and Sealed this

Twenty-eighth Day of July, 2009

JOHN DOLL
*Acting Director of the United States Patent and Trademark Office*